US008633523B2

(12) United States Patent
Park et al.

(10) Patent No.: US 8,633,523 B2
(45) Date of Patent: Jan. 21, 2014

(54) THIN FILM TRANSISTOR AND PIXEL CIRCUIT HAVING THE SAME

(75) Inventors: Jin-Woo Park, Yongin (KR); Dong-Hwan Kim, Yongin (KR)

(73) Assignee: Samsung Display Co., Ltd., Samsung, Giheung-Gu, Yongin, Gyeonggi-Do (KR)

(*) Notice: Subject to any disclaimer, the term of this patent is extended or adjusted under 35 U.S.C. 154(b) by 0 days.

(21) Appl. No.: 13/585,549

(22) Filed: Aug. 14, 2012

(65) Prior Publication Data

US 2013/0306969 A1    Nov. 21, 2013

(30) Foreign Application Priority Data

May 16, 2012  (KR) ......................... 10-2012-0051985

(51) Int. Cl.
*H01L 29/08* (2006.01)
*H01L 29/417* (2006.01)
*H01L 29/786* (2006.01)
*G02F 1/061* (2006.01)

(52) U.S. Cl.
USPC ............... 257/288; 257/66; 257/72; 257/368; 257/E29.117; 257/E51.002

(58) Field of Classification Search
None
See application file for complete search history.

(56) References Cited

U.S. PATENT DOCUMENTS

| 6,133,609 | A | 10/2000 | Nakamura |
| 7,379,039 | B2 | 5/2008 | Yumoto |
| 7,528,021 | B2 | 5/2009 | Park et al. |
| 7,692,191 | B2 | 4/2010 | Kwak et al. |
| 7,803,672 | B2 | 9/2010 | Park et al. |
| 7,816,687 | B2 * | 10/2010 | Chun et al. ........................ 257/72 |
| 2003/0227262 | A1 * | 12/2003 | Kwon .......................... 315/169.3 |
| 2005/0200300 | A1 | 9/2005 | Yumoto |
| 2006/0157711 | A1 | 7/2006 | Kang |
| 2009/0033231 | A1 * | 2/2009 | Koo et al. ................... 315/169.3 |
| 2011/0115835 | A1 * | 5/2011 | Lee ................................ 345/691 |
| 2012/0199854 | A1 * | 8/2012 | Noguchi ......................... 257/88 |

FOREIGN PATENT DOCUMENTS

| KR | 10-2000-0003184 | | 1/2000 |
| KR | 10-2006-0060843 | | 6/2006 |
| KR | 2006060843 | A * | 6/2006 |
| KR | 10-0611769 | | 8/2006 |
| KR | 10-0861756 | | 9/2008 |

OTHER PUBLICATIONS

Machine translation of KR 2006060843 A.*

* cited by examiner

*Primary Examiner* — Thomas L Dickey
*Assistant Examiner* — Joseph Schoenholtz
(74) *Attorney, Agent, or Firm* — Robert E. Bushnell, Esq.

(57) ABSTRACT

A thin film transistor which may be included in a pixel circuit includes: a substrate; a semiconductor layer formed on the substrate and including a source region, a first drain region spaced apart from the source region by a first current path, and a second drain region spaced apart from the source region by a second current path having a length different from that of the first current path; a gate electrode insulated from the semiconductor layer by a gate insulating layer; a source electrode connected to the source region of the semiconductor layer; a first drain electrode connected to the first drain region of the semiconductor layer; and a second drain electrode connected to the second drain region of the semiconductor layer. Currents having different magnitudes may be simultaneously provided through the first current path and the second current path.

13 Claims, 3 Drawing Sheets

THIN FILM TRANSISTOR AND PIXEL CIRCUIT HAVING THE SAME

CLAIM OF PRIORITY

This application makes reference to, incorporates the same herein, and claims all benefits accruing under 35 U.S.C. §119 from an application earlier filed in the Korean Intellectual Property Office on the 16 of May 2012 and there duly assigned Serial No. 10-2012-0051985.

BACKGROUND OF THE INVENTION

1. Field of the Invention

The present invention relates to a thin film transistor and a pixel circuit having the same, and more particularly, to a thin film transistor providing two current paths that have different lengths, and a pixel circuit having the same.

2. Description of the Related Art

A thin film transistor includes a semiconductor layer having a channel region, a source region and a drain region, a gate electrode insulated from the semiconductor layer by a gate insulating layer, and a source electrode and a drain electrode connected to the source region and the drain region, respectively, of the semiconductor layer.

The thin film transistor, configured as described above, may act as a switching device for transferring a signal or a driving device for providing a current path.

In a thin film transistor according to the related art, the channel region between the source region and drain region has a predetermined length. Therefore, in the case in which the thin film transistor acts as a driving device, a predetermined amount of current may flow through a fixed current path. Accordingly, in the case in which different currents are required in order to implement various objects, since a circuit should be configured using a plurality of thin film transistors, the number of components increases and the design is complicated.

SUMMARY OF THE INVENTION

An object of the present invention is to provide a thin film transistor capable of providing two different current paths.

Another object of the present invention is to provide a pixel circuit having a thin film transistor capable of rapidly compensating for a threshold voltage, and providing a predetermined current to a light emitting device A thin film transistor may comprise: a substrate; a semiconductor layer formed on the substrate and including a source region, a first drain region spaced apart from the source region by a first current path, and a second drain region spaced apart from the source region by a second current path having a length different from that of the first current path; a gate electrode insulated from the semiconductor layer by a gate insulating layer; a source electrode connected to the source region of the semiconductor layer; a first drain electrode connected to the first drain region of the semiconductor layer; and a second drain electrode connected to the second drain region of the semiconductor layer.

A pixel circuit may comprise: an organic light emitting diode; a first thin film transistor driving the organic light emitting diode; a second thin film transistor providing a data signal to the first thin film transistor according to a scan signal; a third thin film transistor connecting the first thin film transistor in a diode structure according to the scan signal; and a storage capacitor connected between a gate electrode of the first thin film transistor and a first power supply voltage; wherein the first thin film transistor includes a gate electrode connected to a drain electrode of a third thin film transistor, a first drain electrode connected to a source region of the third thin film transistor, a second drain electrode connected to the organic light emitting diode, and a source electrode connected to a drain electrode of the second thin film transistor.

The pixel circuit may further comprise: a fourth thin film transistor providing an initialization voltage to the gate electrode of the first thin film transistor according to a previous scan signal; a fifth thin film transistor providing the first power supply voltage to the source electrode of the first thin film transistor according to a light emitting control signal; a sixth thin film transistor connecting the second drain electrode of the first thin film transistor to the organic light emitting diode according to the light emitting control signal; and a boost capacitor connected between the gate electrode of the first thin film transistor and a scan line through which the scan signal is supplied.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1A:
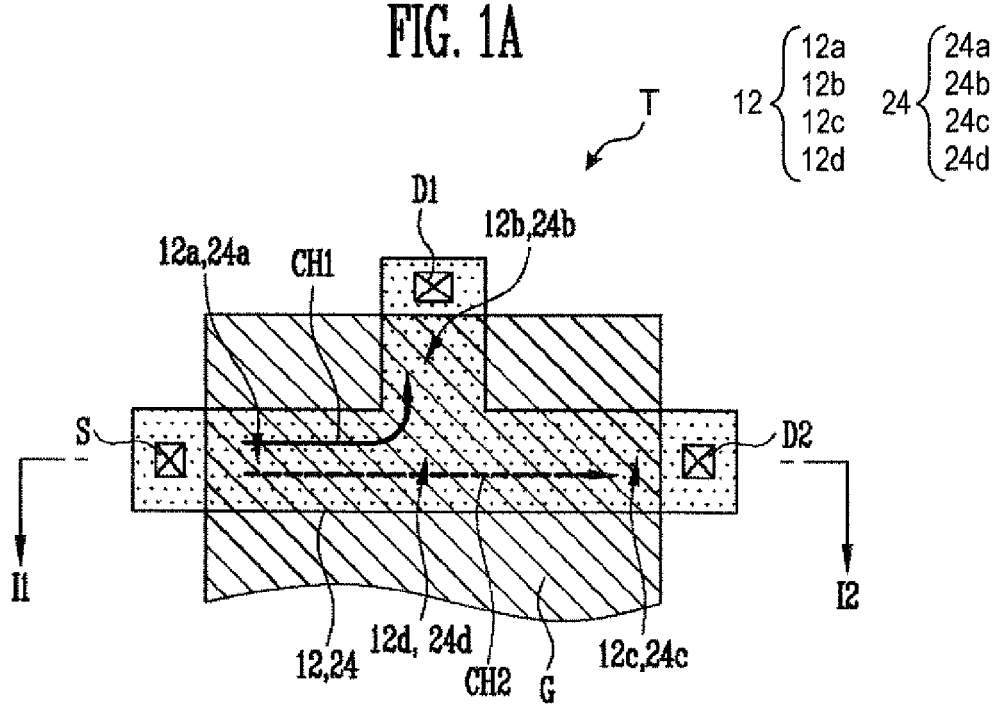
FIG. 1A is a planar view describing a thin film transistor according to an exemplary embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Furthermore, some of the elements that are not essential to a complete understanding of the invention are omitted for clarity. Also, like reference numerals refer to like elements throughout.

Hereinafter, preferred embodiments of the present invention will be described in detail with reference to the accompanying drawings. The following exemplary embodiment is provided in order to allow those skilled in the art to fully understand the present invention, and may be changed into several types. Therefore, the scope of the present invention is not limited to the following exemplary embodiment.

Figure 1B:
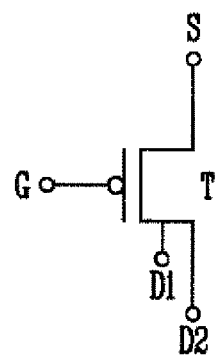
FIG. 1B is a circuit diagram describing the thin film transistor according to the exemplary embodiment of the present invention.

FIG. 1A is a planar view describing a thin film transistor according to an exemplary embodiment of the present invention, and FIG. 1B is a circuit diagram describing the thin film transistor according to the exemplary embodiment of the present invention.

Referring to FIGS. 1A and 1B, the thin film transistor T includes: semiconductor layers 12 and 24 having source regions 12a and 24a, respectively, first drain regions 12b and 24b, respectively, second drain regions 12c and 24c, respectively, and channel regions 12d and 24d, respectively; a gate electrode G electrically insulated from the semiconductor layers 12 and 24; a source electrode S connected to the source regions 12a and 24a of the semiconductor layers 12 and 24, respectively; a first drain electrode D1 connected to the first drain regions 12b and 24b of the semiconductor layers 12 and 24, respectively; and a second drain electrode D2 connected to the second drain regions 12c and 24c of the semiconductor layers 12 and 24, respectively.

The first drain regions 12b and 24b are spaced apart from the source regions 12a and 24a, respectively, by a first current path CH1, and the second drain regions 12c and 24c are spaced apart from the source regions 12a and 24a, respectively, by a second current path CH2 having a length different from that of the first current path CH1. For example, the second current path CH2 may be formed so as to be longer than the first current path CH1. In this case, the semiconductor layers 12 and 24 may be formed in a shape in which a structure providing the first current path CH1 protrudes from a central portion of a structure providing the second current path CH2, for example, a "⊥" shape or a "T" shape, as shown in FIG. 1A. The structures (semiconductor layers) may be formed in a straight line shape or a bent shape as needed.

The gate electrode G is disposed so as to overlap the source regions 12a and 24a of the semiconductor layers 12 and 24, respectively, the channel regions 12d and 24d providing the first and second current paths CH1 and CH2, the first drain regions 12b and 24b, and the second drain regions 12c and 24c.

The semiconductor layers 12 and 24 may be made of amorphous silicon, poly silicon or oxide semiconductor, the gate electrode G may be made of poly silicon or a metal, and the source electrode S, the first drain electrode D1, and the second drain electrode D2 may be made of a metal or an alloy.

Figure 2A:
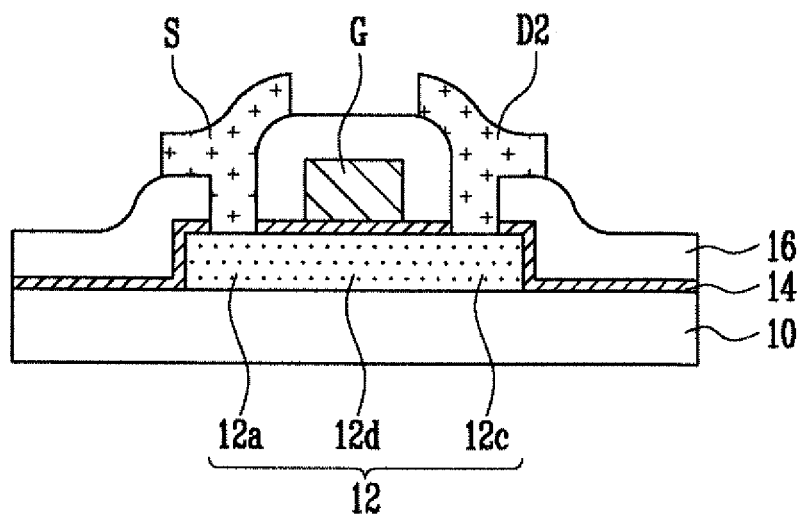
FIG. 2A is a cross-sectional view taken along line 11-12 of FIG. 1A, and describes a thin film transistor having a top gate structure according to an exemplary embodiment of the present invention.

FIG. 2A is a cross-sectional view taken along line I1-I2 of FIG. 1A, and describes a thin film transistor having a top gate structure according to an exemplary embodiment of the present invention. Whereas FIG. 2A is a cross sectional view taken along the line I1-I2 of FIG. 1A, in FIG. 2A, the first drain region 12b and the first drain electrode D1 are not shown.

As seen in FIG. 2A, semiconductor layer 12 is formed on a substrate 10, and the gate insulation layer 14 is formed on the substrate 10 and the semiconductor layer 12. The gate electrode G is formed on the gate insulation layer 14 in an upper portion of the channel region 12d, and an interlayer dielectric 16 is formed on the gate insulating layer 14 and the gate electrode G. Contact holes are formed in the interlayer dielectric 16 so that the source region 12a, the first drain regions 12b and 24b (FIG. 1A), and the second drain regions 12c and 24c (FIGS. 1A and 2A) are exposed, and each of the source electrode S, the first drain electrode D1 (FIG. 1A), and the second drain electrode D2 is formed so as to be connected to the source region 12a, the first drain regions 12b and 24b (FIG. 1A), and the second drain regions 12c and 24c (FIGS. 1A and 2A) through the contact holes.

Figure 2B:
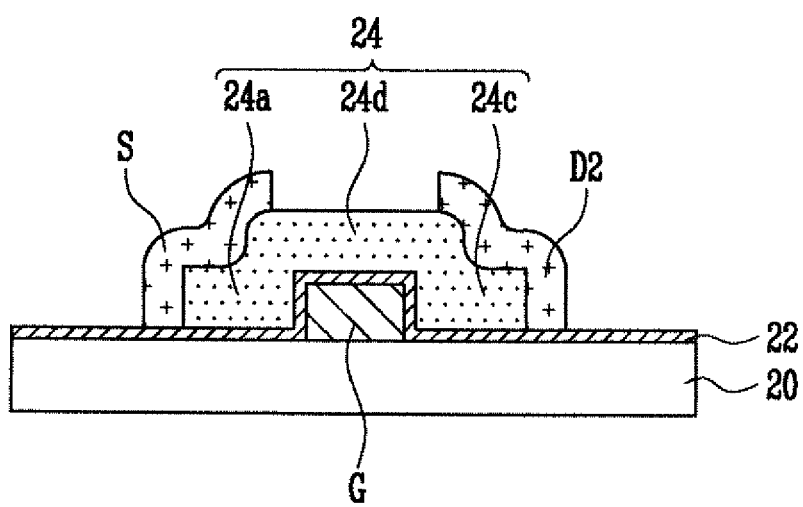
FIG. 2B is a cross-sectional view taken along line 11-12 of FIG. 1A, and describes a thin film transistor having a bottom gate structure according to another exemplary embodiment of the present invention.

FIG. 2B is a cross-sectional view taken along line I1-I2 of FIG. 1A, and describes a thin film transistor having a bottom gate structure according to another exemplary embodiment of the present invention. Whereas FIG. 2B is a cross sectional view taken along the line I1-I2 of the FIG. 1A, in FIG. 2B, the first drain region 24b and the first drain electrode D1 are not shown.

As seen in FIG. 2B, the gate electrode G is formed on a substrate 20, and the gate insulation layer 22 is formed on a substrate 20 having the gate electrode G. The semiconductor layer 24 is formed on the gate insulating layer 22 including the gate electrodes G, and the source electrode S, the first drain electrode D1 (FIG. 1A), and the second drain electrode D2 of the semiconductor layer 24 are formed so as to be connected to the source region 24a, the first drain region 24b (FIG. 1A), and the second drain region 24c.

The thin film transistor configured as described above may provide the first and second current paths CH1 and CH2, respectively, having different lengths, and may provide currents having different current magnitudes (amounts) through the first and second current paths CH1 and CH2, respectively. Since the first current path CH1 has a short length, it may provide relatively large current, and since the second current path CH2 has a long length, it may provide relatively small current.

Since a single thin film transistor may simultaneously provide currents having different magnitudes, a circuit for implementing two different objects may be relatively simply designed, and the number of components may be reduced as compared to the related art, such that it is also advantageous to perform high integration.

The thin film transistor as described above may be applied to a pixel circuit of a flat panel display device, such as an organic light emitting diode (OLED).

Figure 3:
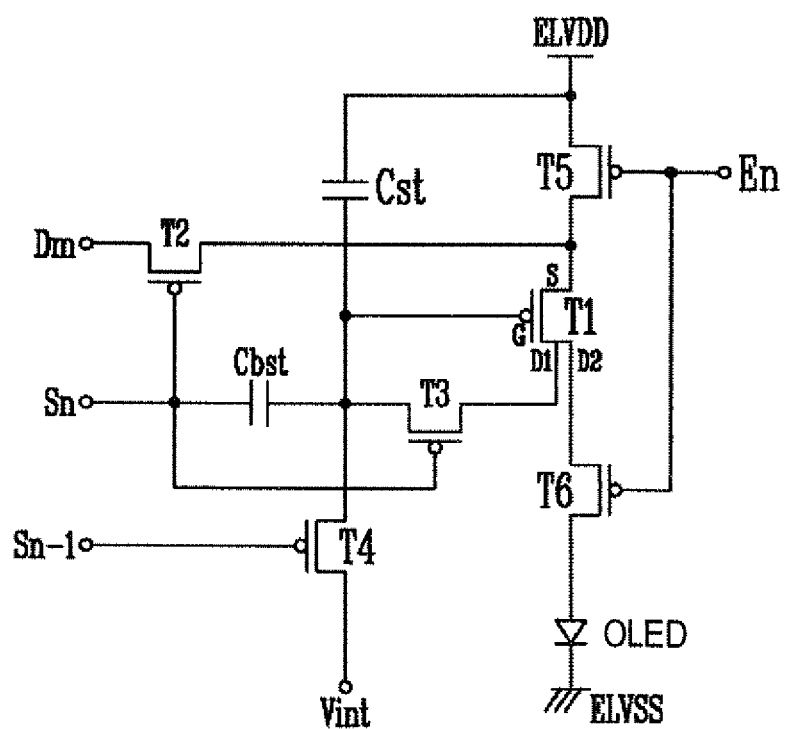
FIG. 3 is a circuit diagram describing a pixel circuit of a flat display device according to an exemplary embodiment of the present invention.

FIG. 3 is a circuit diagram describing a pixel circuit of a flat display device according to an exemplary embodiment of the present invention.

Referring to FIG. 3, the pixel circuit light-emits an OLED at a predetermined brightness, corresponding to a data signal Dm supplied to a data line, when a scan signal Sn is supplied through a scan line.

To this end, the pixel circuit includes: a first thin film transistor T1 driving an OLED; a second thin film transistor T2 providing the data signal Dm to the first thin film transistor T1 according to the scan signal Sn; a third thin film transistor T3 connecting the first thin film transistor T1 in a diode structure according to the scan signal Sn; and a storage capacitor Cst connected between a gate electrode G of the first thin film transistor T1 and a first power supply voltage ELVDD.

The first thin film transistor T1 may be a thin film layer according to the exemplary embodiment of the present invention described with reference to FIGS. 1A and 1B. For example, the first thin film transistor T1 may include: a gate electrode G connected to a drain electrode of the third thin film transistor T3; a first drain electrode D1 connected to a source region of the third thin film transistor T3; a second drain electrode D2 electrically connected to the OLED; and a source electrode S connected to a drain electrode of the second thin film transistor T2.

In addition, the pixel circuit may further include: a fourth thin film transistor T4 supplying an initialization voltage Vint to the gate electrode G of the first thin film transistor T1 according to a previous scan signal Sn-1 applied before the scan signal Sn is applied; a fifth thin film transistor T5 supplying the first power supply voltage ELVDD to the source electrode S of the first thin film transistor T1 according to a light emitting control signal En; a sixth thin film transistor T6 connecting the second drain electrode D2 of the first thin film transistor T1 to the OLED according to the light emitting control signal En; and a boost capacitor Cbst connected between the gate electrode G of the first thin film transistor T1 and the scan line through which the scan signal Sn is supplied.

Further referring to FIG. 3, the pixel circuit according to the exemplary embodiment of the present invention will be described in detail.

The fifth thin film transistor T5, operated by the light emitting control signal En, is connected between the first power supply voltage ELVDD and the source electrode S of the first thin film transistor T1, and the sixth thin film transistor T6, operated by the light emitting control signal En, is connected between the second drain electrode D2 of the first thin film transistor T1 and an anode electrode of the OLED. A cathode electrode of the OLED is connected to a second power supply voltage ELVSS.

The second thin film transistor T2, operated by the scan signal Sn, is connected between the data line through which the data signal Dm is applied and the source electrode S of the first thin film transistor T1, the boost capacitor Cbst is connected between the scan line through which the scan signal Sn is applied and the gate electrode G of the first thin film transistor T1, and the third thin film transistor T3 operated by the scan signal Sn is connected between the gate electrode G of the first thin film transistor T1 and the first drain electrode D1 of the first thin film transistor T1. In addition, the storage capacitor Cst is connected between the gate electrode G of the first thin film transistor T1 and the first power supply voltage ELVDD, and the fourth thin film transistor T4 operated by the previous scan signal Sn-1 is connected between the gate electrode G of the first thin film transistor T1 and the initialization voltage Vint.

The first power supply voltage ELVDD is set to a voltage higher than the second power voltage ELVSS. Although the case in which the electrodes of the first to sixth thin film transistors T1 to T6, respectively, are divided into source electrodes and drain electrodes has been described in the exemplary embodiment of the present invention, the electrodes may be divided into drain electrodes and source electrodes. In addition, although the case in which the thin film transistors T1 to T6 are P type thin film transistors has been shown, they are not limited thereto. For example, when the first to sixth thin film transistor T1 to T6 are N type thin film transistors, the polarities of the scan signal, the data signal, and the light emitting control signal may be reversed.

In the pixel circuit configured as described above, the first thin film transistor T1 charges a voltage corresponding to the date signal Dm according to the scan signal Sn in the storage capacitor Cst, and provides a current corresponding to the voltage charged in the storage capacitor Cst to the OLED. Here, since a threshold voltage may be changed in the first thin film transistor T1 with the passage of time, the third thin film transistor T3 connects the first thin film transistor T1 in a diode structure, thereby compensating for the threshold voltage Vth.

As described with reference to FIGS. 1A and 1B, the first thin film transistor T1 may provide the first and second current paths CH1 and CH2, respectively, having different lengths, and may simultaneously provide currents having different magnitudes through the first and second current paths CH1 and CH2, respectively. Since the first current path CH1 has a short length, it may provide a relatively large current, and since the second current path CH2 has a long length, it may provide a relatively small current.

Therefore, since the relatively large current flowing through the first current path CH1 may rapidly charge the storage capacitor Cst through the third thin film transistor T3 up to a predetermined voltage (compensation voltage) during application of the data signal Dm, the threshold voltage may be rapidly and easily compensated for.

In addition, since the relatively smaller current flowing through the second current path CH2 may be provided to the OLED through the sixth thin film transistor T6, a spot may be prevented. That is, since a change rate in current according to a change in the voltage applied to the gate electrode G is small, a data swing range may increase. Therefore, a data voltage range representing gamma increases and a current deviation between driving thin film transistors having a characteristic deviation (distribution) decreases, making it possible to prevent the spot due to a difference in current magnitude.

When it is assumed that the first thin film transistor T1 is an existing thin film transistor capable of providing only one current path, the current having the same magnitude flows through the third thin film transistor T3 and the sixth thin film transistor T6.

In the case in which the current path of the first thin film transistor T1 is set to be short so that the threshold voltage may be rapidly compensated for, since an s-factor of a transistor transfer curve decreases, such that a change rate in current according to the change in voltage applied to the gate electrode G increases, a large current is provided to the OLED, such that the spot is generated.

On the other hand, in the case in which the current path of the first thin film transistor T1 is set to be long so that the spot is prevented, the threshold voltage is slowly compensated for due to the small current, such that a low gray scale is not compensated for, thereby generating the spot. The higher the resolution, the more serious the problem. That is, since the time in which the data signal Dm is applied decreases as resolution increases, a current flows to the OLED before the threshold voltage Vth is completely compensated for, which causes a current deviation, thereby generating the spot.

The second thin film transistor T2 provides the data signal Dm to the first thin film transistor T1 according to the scan signal Sn, and the third thin film transistor T3 connects the first thin film transistor T1 in the diode structure according to the scan signal Sn.

The fourth thin film transistor T4 provides the initialization voltage Vint to the gate electrode G of the first thin film transistor T1 according to the previous scan signal Sn-1 applied before the scan signal Sn is applied to initialize a potential of the gate electrode G to a predetermined voltage, and the fifth and sixth thin film transistors T5 and T6, respectively, allow the current to flow from the first power supply voltage ELVDD to the OLED according to the light emitting control signal En. The light emitting control signal En may have a potential different from that of the scan signal Sn, and may be set to have a width wider than that of the scan signal Sn. For example, when the scan signal Sn is at a low potential, the light emitting control signal En may be applied at a high potential.

In addition, the storage capacitor Cst is charged with a voltage corresponding to the data signal Dm when the first thin film transistor T1 is operated by the scan signal Sn, and the boost capacitor Cbst allows a potential of the gate electrode G of the first thin film transistor T1, by virtue of the voltage of the scan signal Sn, to be raised to a predetermined level.

Although an example of the pixel circuit has been described in the exemplary embodiment of the present invention, the present invention may be applied to any pixel circuit configured to have a threshold voltage compensation function through appropriate modification.

The thin film transistor according to the exemplary embodiment of the present invention provides two current paths having different lengths. A relatively large current may be provided through the current path having a short length, and a relatively small current may be provided through the current path having a long length. Since the currents having different magnitudes may be simultaneously provided, circuits for implementing two different objects may be simply designed, and the number of components may be reduced, such that it is advantageous to perform high integration.

With the pixel circuit according to the exemplary embodiment of the present invention, since the storage capacitor may be rapidly charged up to the threshold voltage using the large current provided through one current path of the thin film transistor, the threshold voltage may be easily compensated for, and since the organic light emitting diode is driven using the small current provided through another current path, a spot may be prevented. That is, since a change rate of current according to a change in gate voltage is small, the data swing range may increase. Therefore, the data voltage range representing the gamma increases, and the current deviation between the driving thin film transistor having the characteristic deviation (distribution) decreases, thereby making it possible to prevent the spot due to a difference in current magnitude.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor, comprising:
   a substrate;
   a semiconductor layer formed on the substrate, the semiconductor layer including:
      a second channel region extending between a source region formed of the semiconductor layer and a second drain region which is spaced apart from the source region and is formed of the semiconductor layer, and;
      a first channel region intersecting the second channel region and connected to a first drain region which is spaced apart from the source region and from the second drain region and is formed of the semiconductor layer,
      a length of a portion of the second channel region, which extends between the second drain region and an intersection of the first and second channel regions, being different from a length of the first channel region;
   a gate electrode insulated from the semiconductor layer by a gate insulating layer;
   a source electrode connected to the source region of the semiconductor layer;
   a first drain electrode connected to the first drain region of the semiconductor layer; and
   a second drain electrode connected to the second drain region of the semiconductor layer.

2. The thin film transistor according to claim 1, wherein the length of the portion of the second channel region, which extends between the second drain region and the intersection of the first and second channel regions, is longer than the length of the first channel region.

3. The thin film transistor according to claim 1, wherein the semiconductor layer is formed in a T shape.

4. The thin film transistor according to claim 1, wherein the semiconductor is made of one material selected from a group consisting of amorphous silicon, poly silicon, and oxide semiconductor.

5. The thin film transistor according to claim 1, wherein the gate electrode overlaps the source region, the first and second channel regions, and the first and second drain regions of the semiconductor layer.

6. The thin film transistor according to claim 1, further comprising an interlayer dielectric formed on the gate insulating layer and the gate electrode, wherein the source electrode, the first drain electrode and the second drain electrode are connected to the source region, the first drain region and the second drain region, respectively, of the semiconductor through contact holes formed on the interlayer dielectric.

7. A pixel circuit, comprising:
   an organic light emitting diode;
   a first thin film transistor driving the organic light emitting diode;
   a second thin film transistor providing a data signal to the first thin film transistor according to a scan signal;
   a third thin film transistor connecting the first thin film transistor in a diode structure according to the scan signal; and
   a storage capacitor connected between a gate electrode of the first thin film transistor and a first power supply voltage,
   the first thin film transistor including the gate electrode connected to a drain electrode of the third thin film transistor, a first drain electrode connected to a source electrode of the third thin film transistor via a first path, a second drain electrode connected to the organic light emitting diode via a second path discrete from the first path, and a source electrode connected to a drain electrode of the second thin film transistor.

8. The pixel circuit according to claim 7, wherein the first thin film transistor includes:
   a substrate;
   a semiconductor layer formed on the substrate, the semiconductor layer including:
      a second channel region extending between a source region formed of the semiconductor layer and a second drain region which is spaced apart from the source region and is formed of the semiconductor layer, and;
      a first channel region intersecting the second channel region and connected to a first drain region which is spaced apart from the source region and from the second drain region and is formed of the semiconductor layer,
      a length of a portion of the second channel region, which extends between the second drain region and an intersection of the first and second channel regions, being different from a length of the first channel region;
   the gate electrode insulated from the semiconductor layer by a gate insulating layer;
   the source electrode of the first thin film transistor connected to the source region of the semiconductor layer;
   the first drain electrode connected to the first drain region of the semiconductor layer; and
   the second drain electrode connected to the second drain region of the semiconductor layer.

9. The pixel circuit according to claim 8, the length of the portion of the second channel region, which extends between the second drain region and the intersection of the first and second channel regions, is longer than the length of the first channel region.

10. The pixel circuit according to claim 8, wherein the semiconductor layer is formed in a T shape.

11. The pixel circuit according to claim 8, wherein the gate electrode overlaps the source region the first and second channel regions, and the first and second drain regions of the semiconductor layer.

12. The pixel circuit according to claim 7, further comprising:
- a fourth thin film transistor providing an initialization voltage to the gate electrode of the first thin film transistor according to a previous scan signal;
- a fifth thin film transistor providing the first power supply voltage to the source electrode of the first thin film transistor according to a light emitting control signal; and
- a sixth thin film transistor connecting the second drain electrode of the first thin layer transistor to the organic light emitting diode according to the light emitting control signal.

13. The pixel circuit according to claim 7, further comprising a boost capacitor connected between the gate electrode of the first thin film transistor and a scan line through which the scan signal is supplied.

* * * * *